(12) United States Patent
Jeong

(10) Patent No.: US 9,484,322 B1
(45) Date of Patent: Nov. 1, 2016

(54) SEMICONDUCTOR PACKAGES WITH SLIDING INTERCONNECT STRUCTURE

(71) Applicant: SK hynix Inc., Icheon-si Gyeonggi-do (KR)

(72) Inventor: Chan Woo Jeong, Chungju-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/925,235

(22) Filed: Oct. 28, 2015

(30) Foreign Application Priority Data

Jun. 19, 2015 (KR) ........................ 10-2015-0087726

(51) Int. Cl.
  *H01L 23/48* (2006.01)
  *H01L 23/00* (2006.01)

(52) U.S. Cl.
  CPC ..................... *H01L 24/72* (2013.01)

(58) Field of Classification Search
  CPC .............. H01L 24/72; H01L 25/0756; H01L 2225/06572
  USPC .................................. 257/690, 737
  See application file for complete search history.

(56) References Cited

U.S. PATENT DOCUMENTS

| | | | | |
|---|---|---|---|---|
| 4,410,227 A * | 10/1983 | Prunella | ............. | G01R 31/2886 209/573 |
| 6,060,893 A | 5/2000 | Farnworth et al. | | |
| 6,184,576 B1 * | 2/2001 | Jones | ................. | G01R 1/07378 257/48 |
| 6,917,102 B2 * | 7/2005 | Zhou | ................... | G01R 1/07378 257/690 |
| 7,435,108 B1 * | 10/2008 | Eldridge | ............ | G01R 1/06727 439/66 |
| 2004/0201390 A1 * | 10/2004 | Farnworth | ........... | G01R 1/0466 324/754.08 |
| 2005/0239300 A1 * | 10/2005 | Yasumura | .......... | H01R 13/6587 439/65 |
| 2014/0029202 A1 * | 1/2014 | Bian | ....................... | H01L 23/36 361/707 |
| 2015/0279768 A1 * | 10/2015 | Rathburn | .......... | H01L 23/49811 174/251 |
| 2015/0279803 A1 * | 10/2015 | van Gemert | .......... | B81B 7/0048 257/737 |
| 2015/0364838 A1 * | 12/2015 | Tonoike | ................. | H01R 4/187 439/879 |
| 2016/0183374 A1 * | 6/2016 | Prakash | ................. | H05K 1/181 361/719 |

FOREIGN PATENT DOCUMENTS

KR  20020087766 A  11/2002

* cited by examiner

*Primary Examiner* — Nitin Parekh
(74) *Attorney, Agent, or Firm* — William Park & Associates Ltd.

(57) ABSTRACT

A semiconductor package includes a first substrate including a plurality of first connecting portions disposed thereon, a second substrate disposed on a portion of the first substrate to be adjacent to the first connecting portions and including a plurality of conductive contact rails disposed thereon, and a plurality of conductive cantilevers respectively placed in contact with surfaces of the conductive contact rails so that one end portion of each conductive cantilever is electrically coupled to one of the first connecting portions and the other end portion slides along one of the conductive contact rails.

12 Claims, 21 Drawing Sheets

US 9,484,322 B1

SEMICONDUCTOR PACKAGES WITH SLIDING INTERCONNECT STRUCTURE

CROSS-REFERENCE TO RELATED APPLICATION

The present application claims priority under 35 U.S.C 119(a) to Korean Application No. 10-2015-0087726 filed on Jun. 19, 2015, in the Korean intellectual property Office, which is incorporated herein by reference in its entirety.

BACKGROUND

1. Technical Field

The present disclosure generally relates to a semiconductor package technology, and more particularly to a semiconductor package with a sliding-interconnect structure.

2. Related Art

Developments of portable electronic systems are leading to demands for highly integrated semiconductor devices capable of processing a large amount of data at a time. In response to the demands of mobile systems, manufacturers of semiconductor devices keep trying to reduce the package size of the semiconductor devices. Also, as a wearable electronic system becomes a more commonplace item, it has become a significant challenge to manufacture a semiconductor package that allows the wearable electronic systems more flexibility. Accordingly, the flexibility of semiconductor packages is also required to be improved.

Not only a package substrate but also semiconductor chips mounted thereon can be manufactured to be thin enough that they would not break when bent. Accordingly, an interconnect structure that maintain an electrical connection between two or more components such as the semiconductor chips and the package substrate even when they are bent is the key to success in manufacturing a flexible semiconductor package.

SUMMARY

According to an embodiment, a semiconductor package includes a first substrate including a plurality of first connecting portions disposed thereon, a second substrate disposed on a portion of the first substrate to be adjacent to the first connecting portions and including a plurality of conductive contact rails disposed thereon, and a plurality of conductive cantilevers respectively contacting surfaces of the conductive contact rails so that one end portion of each conductive cantilever is electrically coupled to one of the first connecting portions and the other end portion slides along one of the conductive contact rails.

According to another embodiment, a semiconductor package includes a first substrate and a second substrate. The first substrate includes a plurality of conductive contact rails disposed thereon. The second substrate includes a plurality of connecting projections respectively contacting surfaces of the conductive contact rails so that the connecting projections slide along the conductive contact rails.

According to another embodiment, there is provided a memory card including a semiconductor package. The semiconductor package includes a first substrate including a plurality of first connecting portions disposed thereon, a second substrate disposed on a portion of the first substrate to be adjacent to the first connecting portions and including a plurality of conductive contact rails disposed thereon, and a plurality of conductive cantilevers respectively contacting surfaces of the conductive contact rails so that one end portion of each conductive cantilever is electrically coupled to one of the first connecting portions and the other end portion slides along one of the conductive contact rails.

According to another embodiment, there is provided a memory card including a semiconductor package. The semiconductor package includes a first substrate and a second substrate. The first substrate includes a plurality of conductive contact rails disposed thereon. The second substrate includes a plurality of connecting projections respectively contacting surfaces of the conductive contact rails so that the connecting projections slide along the conductive contact rails.

According to another embodiment, there is provided an electronic system including a semiconductor package. The semiconductor package includes a first substrate including a plurality of first connecting portions disposed thereon, a second substrate disposed on a portion of the first substrate to be adjacent to the first connecting portions and including a plurality of conductive contact rails disposed thereon, and a plurality of conductive cantilevers respectively contacting surfaces of the conductive contact rails so that one end portion of each conductive cantilever is electrically coupled to one of the first connecting portions and the other end portion slides along one of the conductive contact rails.

According to another embodiment, there is provided an electronic system including a semiconductor package. The semiconductor package includes a first substrate and a second substrate. The first substrate includes a plurality of conductive contact rails disposed thereon. The second substrate includes a plurality of connecting projections respectively contacting surfaces of the conductive contact rails so that the connecting projections slide along the conductive contact rails.

BRIEF DESCRIPTION OF THE DRAWINGS

Embodiments of the present disclosure will become more apparent in view of the attached drawings and accompanying detailed description, in which.

DETAILED DESCRIPTION OF THE EMBODIMENTS

Figure 1:
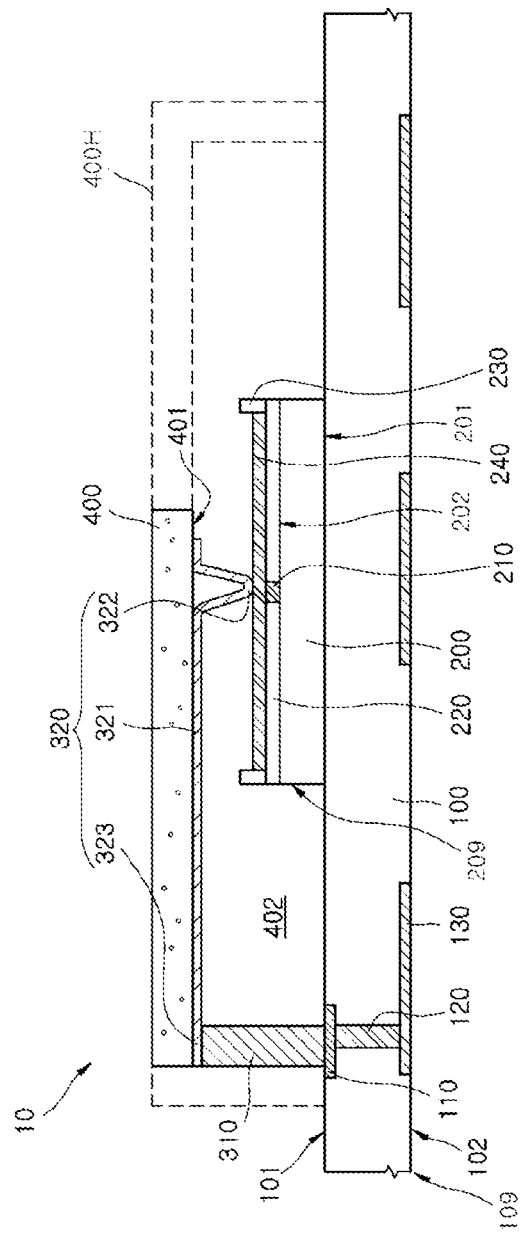
FIGS. 1 to 3 are cross-sectional views illustrating a semiconductor package according to an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong. It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the inventive concept.

Semiconductor packages may include electric devices such as semiconductor chips, and the semiconductor chips may be obtained by separating a semiconductor substrate such as a wafer into a plurality of pieces using a die sawing process. The semiconductor chips may correspond to memory chips or logic chips. The memory chips may include dynamic random access memory (DRAM) circuits, static random access memory (SRAM) circuits, flash circuits, magnetic random access memory (MRAM) circuits, resistive random access memory (ReRAM) circuits, ferroelectric random access memory (FeRAM) circuits or phase change random access memory (PcRAM) circuits which are integrated on and/or in the semiconductor substrate. The logic chips may include logic circuits which are integrated on and/or in the semiconductor substrate. The semiconductor packages may be applied to information/communication systems such as mobile terminals, electronic systems associated with biotechnology or health care, or wearable electronic systems.

Same reference numerals refer to same elements throughout the specification. Thus, even though a reference numeral is not mentioned or described with reference to a drawing, the reference numeral may be mentioned or described with reference to another drawing. In addition, even though a reference numeral is not shown in a drawing, it may be mentioned or described with reference to another drawing.

Figure 2:
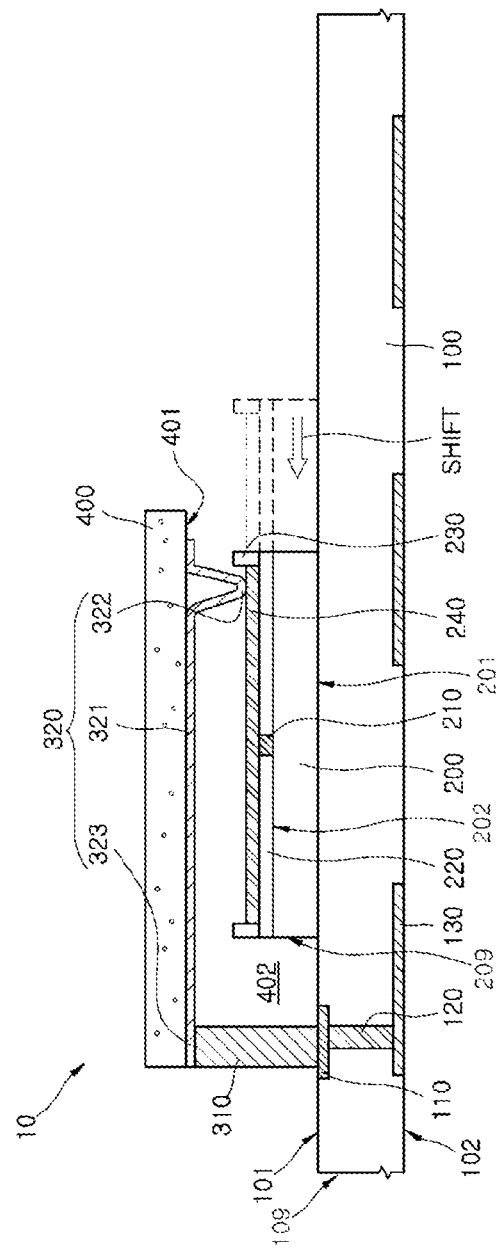
Figure 3:
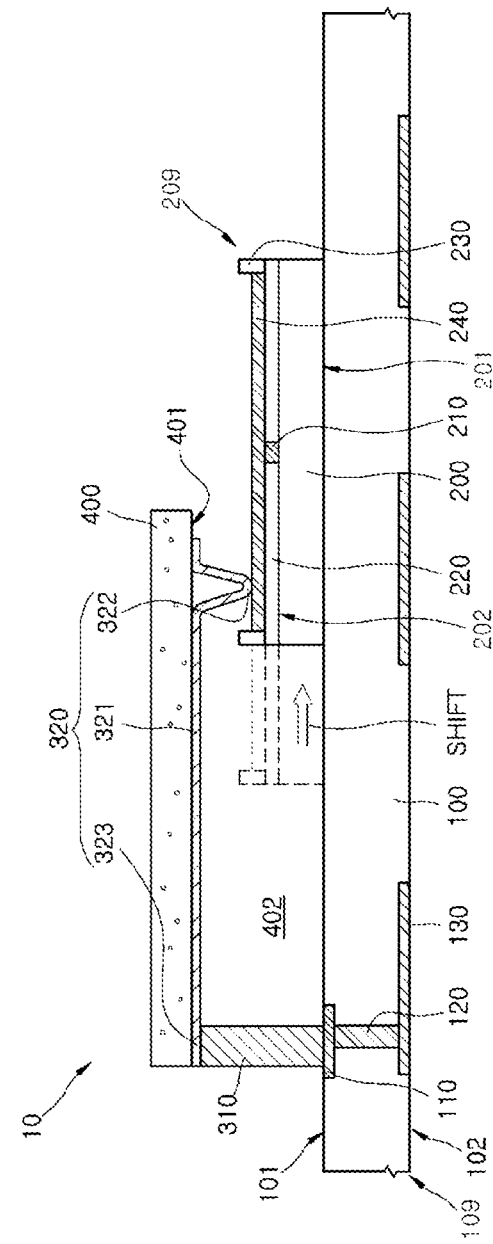

FIG. 1 illustrates a semiconductor package 10 according to an embodiment, and FIGS. 2 and 3 illustrate a second substrate 209 relatively shifted with respect to a first substrate 109.

Referring to FIG. 1, the semiconductor package 10 may include two or more substrates stacked on top of the other. In an embodiment, the semiconductor package 10 may include the first substrate 109 and the second substrate 209 disposed on the first substrate 109. An interconnect structure electrically and signally connecting the first substrate 109 to the second substrate 209 may include a conductive contact rail 240 and a conductive cantilever 320. A portion of the conductive contact rail 240 and a portion of the conductive cantilever 320 may be placed into mechanical, physical contact with each other to establish an electrical connection between the conductive contact rail 240 and the conductive cantilever 320.

The conductive cantilever 320 may include a probe-shaped portion 322 disposed on a surface of the conductive contact rail 240. The probe-shaped portion 322 may have a pin shape, a pointed-tip shape, a curved shape, or a tapered shape. At least a portion of the probe-shaped portion 322 may have a contact with the surface of the conductive contact rail 240. In an embodiment, a mechanism that presses the probe-shaped portion 322 against the surface of the conductive contact rail 240 may allow the probe-shaped portion 322 to freely slide along the surface of the conductive contact rail 240.

Since the probe-shaped portion 322 of the conductive cantilever 320 is not fixed to the surface of the conductive contact rail 240, the probe-shaped portion 322 may slide along the surface of the conductive contact rail 240 while maintaining an electrical connection between the probe-shaped portion 322 and the surface of the conductive contact rail 240. That is, even if the relative position of the probe-shaped portion 322 varies, the electrical connection the probe-shaped portion 322 and the conductive contact rail 240 may be maintained. Even if the position of the second substrate 209 on the first substrate 109 varies as illustrated in FIGS. 2 and 3, the electrical connection of the probe-shaped portion 322 and the conductive contact rail 240 may be continuously maintained. Accordingly, the electrical connection between the first substrate 109 and the second substrate 209 may be maintained. Even if the semiconductor package 10 is warped in a so-called 'cry shape' or a 'smile shape,' the probe-shaped portion 322 may slide along the surface of the conductive contact rail 240 to maintain the electrical connection thereof to the conductive contact rail 240. For example, even if at least one of the first substrate 109 and the second substrate 209 is warped, the probe-shaped portion 322 may slide along the surface of the conductive contact rail 240 while continuing to press itself against the surface of the conductive contact rail 240 to maintain the electrical connection thereto. Therefore, the electrical connection between the probe-shaped portion 322 and the conductive contact rail 240 may be continuously maintained.

The first substrate 109 may be a package substrate on which semiconductor chips are mounted. Examples of the package substrate may include a printed circuit board, an embedded substrate, and a flexible printed circuit board. The package substrate may be a flexible substrate capable of being warped or bent.

The first substrate 109 may include a substrate body 100 and a first connecting portion 110. The substrate body 100 may include a flexible material such as a polymer material containing polyimide. The first connecting portion 110 may be disposed on a third surface 101 of the substrate body 100 that faces a first surface 201 of the second substrate 209. In an embodiment, the second substrate 209 may include a semiconductor chip body 200 having a second surface 202, which faces away from the first surface 201. In another embodiment, the second substrate 209 may include a second substrate body instead of the semiconductor chip body 200. The first connecting portion 110 may be provided as a trace pattern comprised of a conductive material such as cooper (Cu) and may be served as a landing pad to which another connecting member is connected. Although not illustrated in the drawings, other trace patterns constituting signal lines may be additionally disposed on the third surface 101 of the substrate body 100.

Second connecting portions 130 may be disposed on a fourth surface 102 of the substrate body 100 facing away from the second substrate 209 to have a pad form. The second connecting portions 130 may be provided as external-connection terminals electrically connecting the semiconductor package 10 to external members such as mother boards or other electronic devices. Although not illustrated, connecting members such as bumps or solder balls may be bonded to the second connecting portions 130.

An internal connection portion 120 may be formed in the substrate body 100 of the first substrate 109 to connect the first connecting portion 110 to the second connecting portion 130. The internal connection portion 120 may include a via that passes through the substrate body 100 of the first substrate 109. The substrate body 100 of the first substrate 109 may further include inner trace patterns (not shown) constituting internal signal lines to be electrically connected to the via. That is, the inner trace patterns may be embedded in the substrate body 101 of the first substrate 109.

The semiconductor package 10 may include the first substrate 109 and the second substrate 209 mounted on the first substrate 109. The second substrate 209 may be provided in the shape of a semiconductor chip. Alternatively, the second substrate 209 may be provided in the shape of another package including semiconductor chips. The second substrate 209 may include a dielectric layer portion 220 disposed on the second surface 202 of the semiconductor chip body 200. The conductive contact rail 240 disposed on the dielectric layer portion 220 may have a linear shape, a long rectangular shape, or a bar shape that extends along the semiconductor chip body 200. The dielectric layer portion 220 may be formed of a dielectric material or an insulation material to isolate the conductive contact rail 240 from the semiconductor chip body 200. The dielectric layer portion 220 may formed of a polymer layer such as polyimide (PI) or an insulation layer such as silicon oxide ($SiO_2$), silicon nitride ($Si_3N_4$), or silicon oxynitride (SiON).

A contact connecting portion 210 may be formed in the dielectric layer portion 220 to electrically connect the conductive contact rail 240 to the semiconductor chip body 200. The contact connecting portion 210 may penetrate through the dielectric layer portion 220. In an embodiment, the contact connecting portion 210 may have a shape of a chip pad electrically connected to an integrated circuit that is formed in the semiconductor chip body 200. The conductive contact rail 240 may be disposed on the dielectric layer portion 220. The conductive contact rail 240 may include a conductive pattern formed using a re-distributed layer process. For example, the conductive contact rail 240 may be formed of a conductive material such as copper (Cu).

The conductive contact rail 240 may be provided as an extension portion that is bonded to the contact connecting portion 210 and extending the contact connecting portion 210 to the edge portion of the semiconductor chip body 200. In an embodiment, the contact connecting portion 210 may be provided in the shape of a center pad and may be disposed at the center portion of the semiconductor chip body 200. In an embodiment, the contact connecting portion 210 may be provided in the shape of an edge pad and may be disposed at the edge portion of one or both sides of the semiconductor chip body 200. Also, guide portions 230 including a dielectric material or an insulation material therein may be provided to expose at least a portion of the conductive contact rail 240 disposed on the dielectric layer portion 220. The guide portions 230 may be a confining dam limiting an area where the probe-shaped portion 322 of the conductive cantilever 320 can move while maintaining an electrical connection to the conductive contact rail 240.

The conductive cantilever 320 may include the probe-shaped portion 322 at the end portion thereof and a second connection portion 323 at the other end portion facing away from the end portion. The conductive cantilever 320 may be a plate-type member or a linear type member including a body 321 that connects the second connection portion 323 and the probe-shaped portion 322. The body 321 of the conductive cantilever 320, which is disposed over the second substrate 209, may be spaced apart from the second substrate 209. The body 321 of the conductive cantilever 320 may be extended along a direction in which the conductive contact rail 240 disposed on the second substrate 209 is extended.

A conductive pillar 310 may connect the second connection portion 323 of the conductive cantilever 320 to the first substrate 109. An end portion of the conductive pillar 310 may be connected to the first connecting portion 110 of the first substrate 109 and the other end portion of the conductive pillar 310 may be connected to the second connection portion 323, thus the conductive pillar 310 may support the conductive cantilever 320 and electrically connect the cantilever 320 to the first connecting portion 110. The semiconductor package 10 in accordance with an embodiment may include more than one conductive pillar 310. The conductive pillar 310 may be fixed to the first substrate 109 so as to provide a clip shape that allows the second substrate 209 to be inserted into the space 402 between the conductive cantilever 320 and the first substrate 109. The conductive pillar 310, which is erected on the first connecting portion 110, may be formed of a conductive material such as copper (Cu). The conductive pillar 310 may also include one or more of a metal bump, a stud, and a pin. In an embodiment, the conductive pillar 310 may also have an insulating layer (not shown) covering the surface thereof.

A protection lid 400 may be attached to the conductive cantilever. In cases where the semiconductor package 10 has a plurality of conductive cantilevers 320, the protection lid 400 may support the cantilevers 320. The conductive cantilever 320 may include a metal layer such as thin copper (Cu) or copper alloy. The probe-shaped portion 322 of the conductive cantilever 320 may be formed by bending a portion of the conductive cantilever 320 so that the probe-shaped portion 322 protrudes from the conductive cantilever 320 to face the conductive contact rail 240. The conductive cantilever 320 may be formed of a metal having a high elastic limit so as to be more resistant to deformation when the probe-shaped portion 322 is brought into contact with the conductive contact rail 240 and slides on the conductive contact rail 240. The protection lid 400 may be formed of electrically insulating materials such as dielectric material. The protection lid 400 may be a part of a protection cap 400H disposed over the first substrate 109 so as to provide an inner space 402 where the second substrate 209 is to be disposed. The protection cap 400H may provide the inner space 402, which allows the second substrate 209 to move in the inner space 402, by disposing end portions of the protection cap 400H over the conductive pillar 310 erected on the first substrate 109. The protection cap 400H may be formed of a dielectric material or an insulation material. In some embodiments, the protection cap 400H may be formed of a metallic material. The semiconductor package may further include an additional insulation member (not illustrated) on the surface 401 to insulate the conductive cantilever 320.

The protection lid 400 or the protection cap 400H, which supports the conductive cantilever 320, may apply pressure so that one or more portions (e.g., a pointed tip) of the probe-shaped portion 322 of the conductive cantilever 320 may be placed in contact with the surface of the conductive contact rail 240. The second substrate 209 may be inserted into the inner space 402 formed under the protection lid 400 or the protection cap 400H, and the conductive cantilever 320 presses the conductive contact rail 240. As a result, the second substrate 209 may maintain the position thereof on the first substrate 109. As illustrate in FIGS. 2 and 3, even if the second substrate 209 moves along the surface of the first substrate 109, the conductive cantilever 320 may keep applying pressure, and thus one or more portions of the probe-shaped portion 322 of the conductive cantilever 320 may continue to be placed in contact with the conductive contact rail 240.

Figure 4:
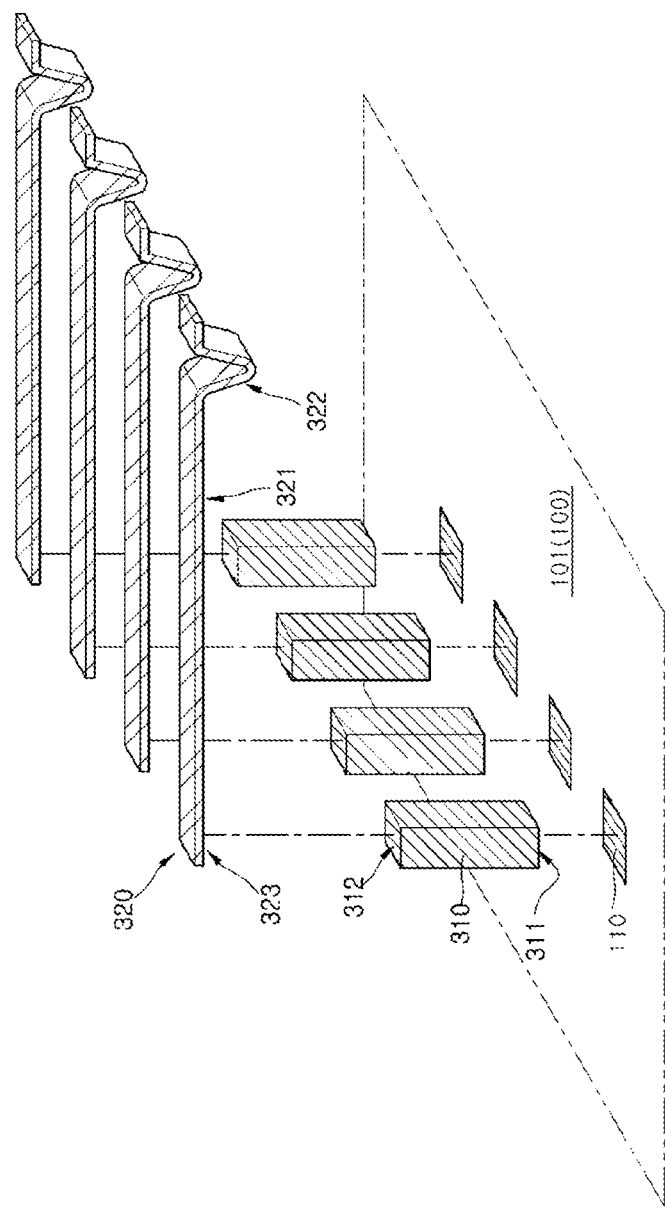
FIGS. 4 to 6 illustrate conductive cantilevers employed in a semiconductor package according to an embodiment.
Figure 5:
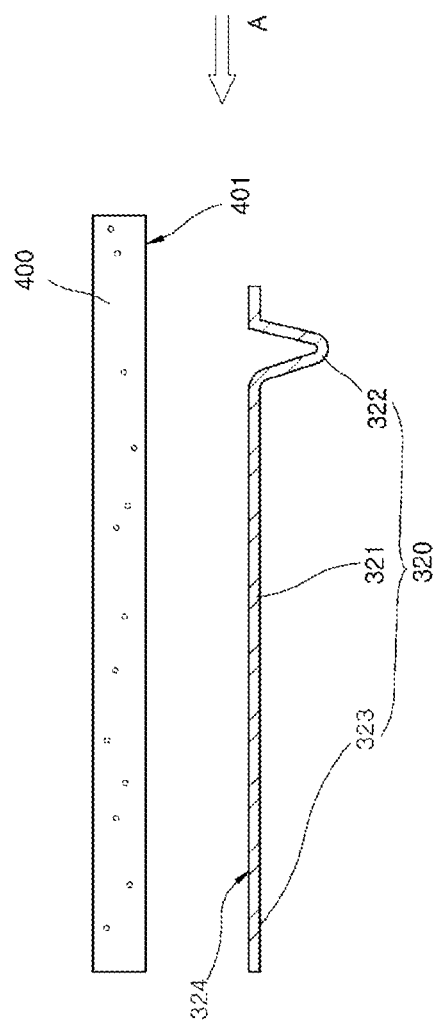
Figure 6:
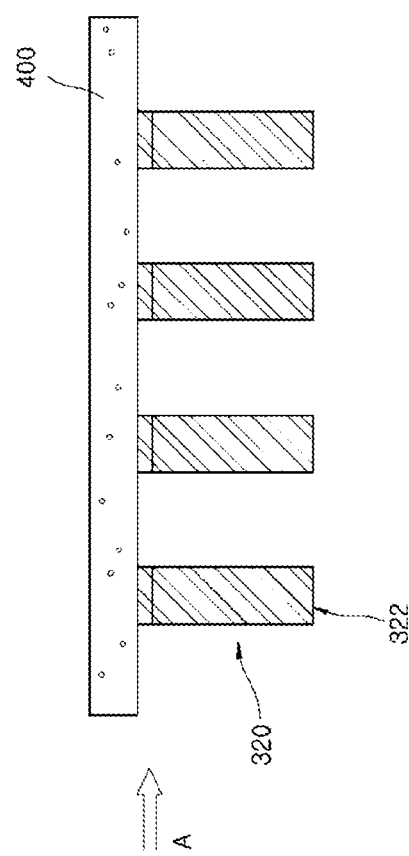

FIGS. 4 to 6 illustrate the shapes of the conductive cantilever 320 of FIG. 1.

Referring to FIG. 4 together with FIG. 1, a plurality of conductive cantilevers 320 may be disposed side by side. The conductive cantilevers 320 may be spaced apart from each other so as to carry different signals to the second substrate 209 of FIG. 1, and a plurality of conductive pillars 310 and a plurality of first connecting portions 110 may be disposed to correspond to each of the conductive cantilever 320. The first connecting portions 110 corresponding to the second connection portions 323 of each conductive cantilever 320 may be arranged on the third surface 101 of the first substrate 109 side by side. The second connection portions 323 may have a landing-pad shape. Each of the conductive pillar 310 may have a bottom end portion 311 and a upper end portion 312. The bottom end portion 311 is connected to the first connection portion 110, and the second connection portion 323 of each conductive cantilever 320 is connected to the upper end portion 312 so that the conductive cantilever 320 may be connected to the third surface 101 of the first substrate 109.

Referring to FIG. 5 together with FIG. 4, the protection lid 400 that has a surface 401 corresponding to the surface 324 exposed in a direction opposite to the direction in which the probe-shaped portion 322 of the conductive cantilever 320 protrudes may be formed, and the surface 324 of the conductive cantilever 320 may be bonded to the surface 401 of the protection lid 400 so that the conductive cantilever 320 may be supported. As illustrated in FIG. 6 that illustrates a feature in the direction A of FIG. 5, the conductive cantilevers 320 may be disposed on the protection lid 400 to be adjacent each other side by side.

FIGS. 7 to 10 show the conductive contact rail 240 of FIG. 1.

Figure 7:
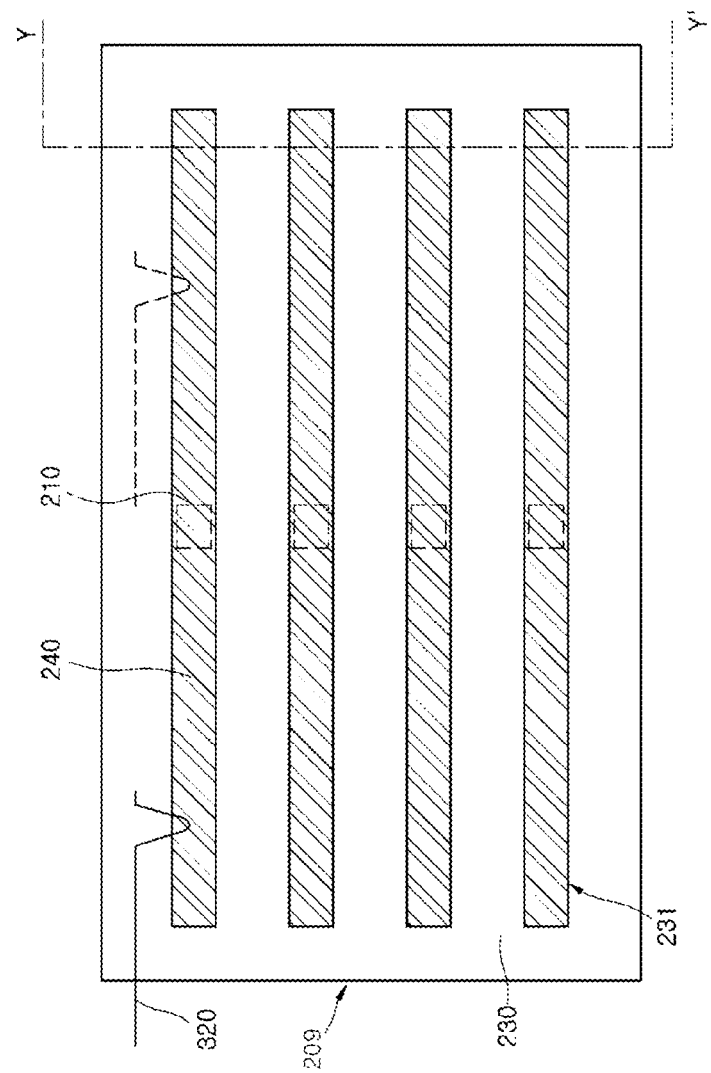
FIGS. 7 to 10 illustrate conductive contact rails employed in a semiconductor package according to an embodiment.
Figure 10:
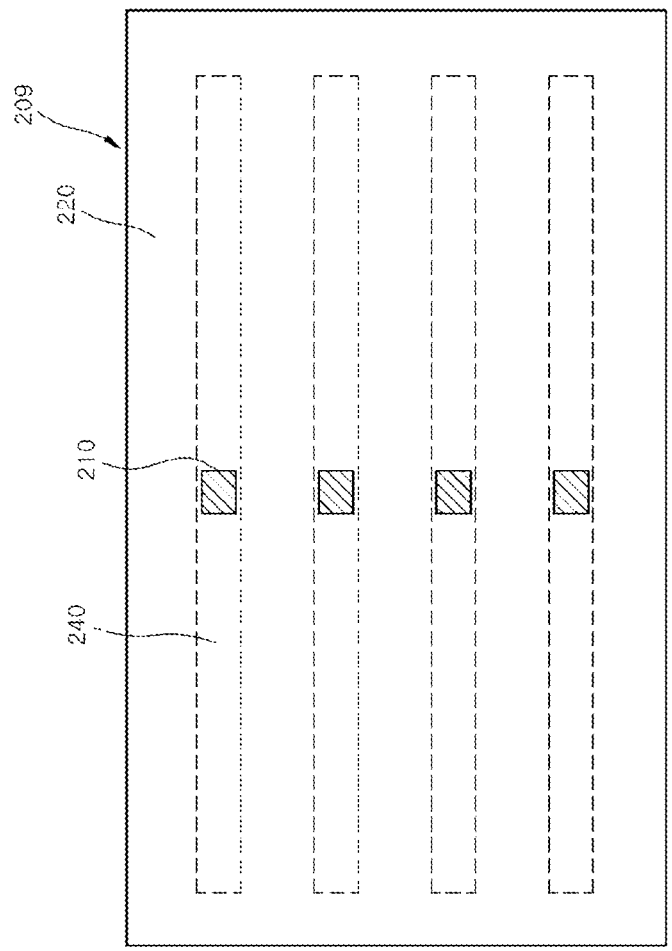

Referring to FIG. 7 together with FIG. 1, a plurality of conductive contact rails 240 may be disposed on the second substrate 209 such that each of the conductive contact rails 240 extends side by side along a certain direction. The conductive contact rail 240, as illustrated in FIG. 10, may be disposed to overlap with the contact connecting portion 210, which penetrates through the dielectric layer portion 220, to be electrically connected to the contact connecting portion 210 and the semiconductor chip body 200 of FIG. 1. In an embodiment, one or more contact connecting portions 210, each of which has a center pad shape, may be disposed in a row on the center of the second substrate 209. In an embodiment, each conductive contact rail 240, which has a linear shape, may overlap with one of the contact connecting portions 210. Each of the conductive cantilever 320 may be brought into contact with one of the conductive contact rails 240. The conductive cantilever 320 may be allowed to slide along the direction in which the conductive contact rail 240 extends.

Figure 8:
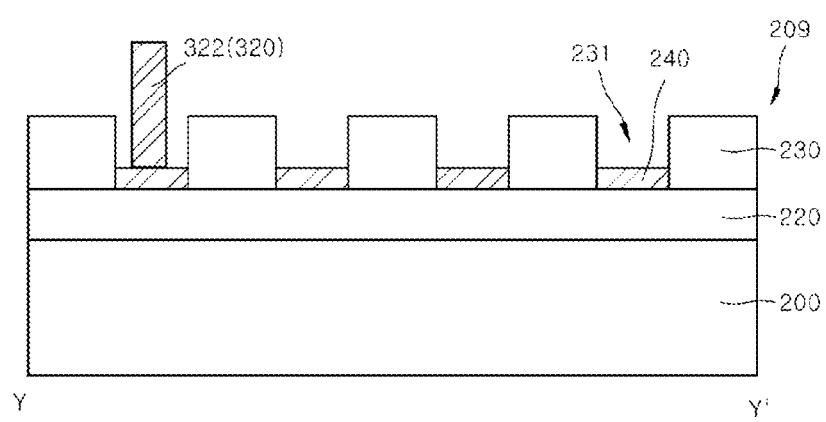
Figure 9:
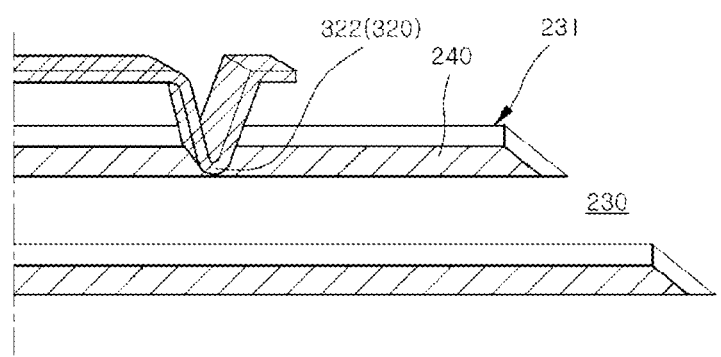

Referring to FIG. 9, the conductive contact rails 240 may be isolated from each other by a guide portion 230, and at least a part of each conductive contact rail 240 may be exposed by the guide portion 230. The guide portion 230 may be a dielectric layer pattern providing guide trenches 231 exposing a surface of each conductive contact rail 240 as an opening portion. As illustrated in FIG. 8 that shows the cross-section taken along the Y-Y' line of FIG. 7, conductive layer patterns forming each conductive contact rail 240 may be provided on the bottom portions of the guide trenches 231, and each of the guide portions 230 may be thicker than the conductive layer pattern. As a result, the guide trenches 231 of concave grooves may be formed on the surface of the conductive contact rails 240.

The guide portion 230 may have a height higher than that of the surface of the conductive contact rails 240. The guide portion 230, as shown in FIG. 9, may allow the probe-shaped portion 322 of the conductive cantilever 320 to move along the guide trenches 231 and prevent the probe-shaped portion 322 of the conductive cantilever 320 from coming out of the guide trench 231. The guide portion 230 providing the guide trench 231 and the dielectric layer portion 220 may be formed of a plurality of layers stacked on top of the other. Alternatively, the guide portions 230 and the dielectric layer portion 220 may be formed as a single layer having the guide trench 231. Both sides of the guide portion 230 formed in the guide trench 231 may prevent the conductive cantilever 320 from coming out of the guide trench 231.

Figure 11:
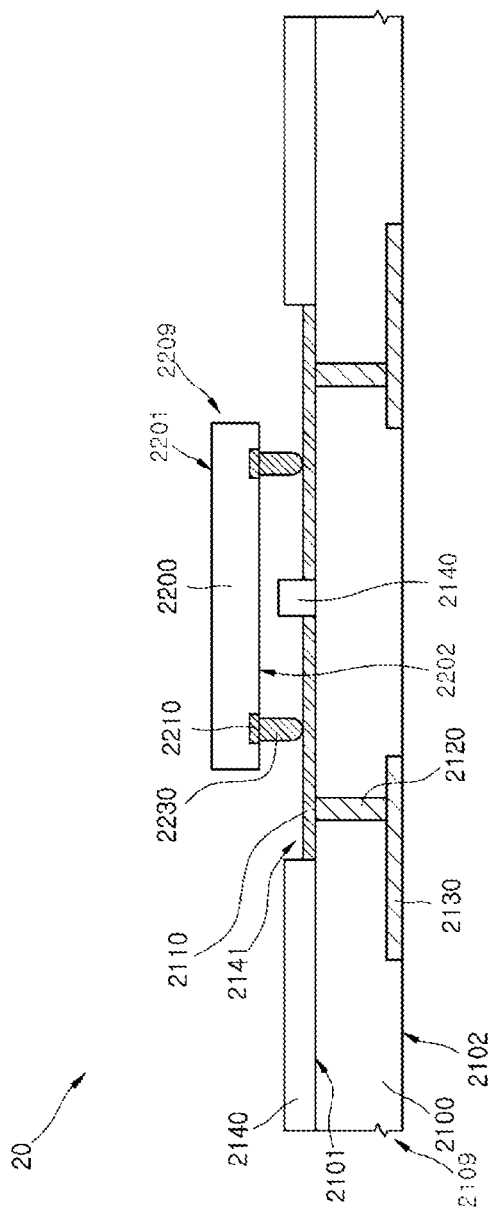
FIGS. 11 to 13 are cross-sectional views illustrating a semiconductor package according to an embodiment.
Figure 12:
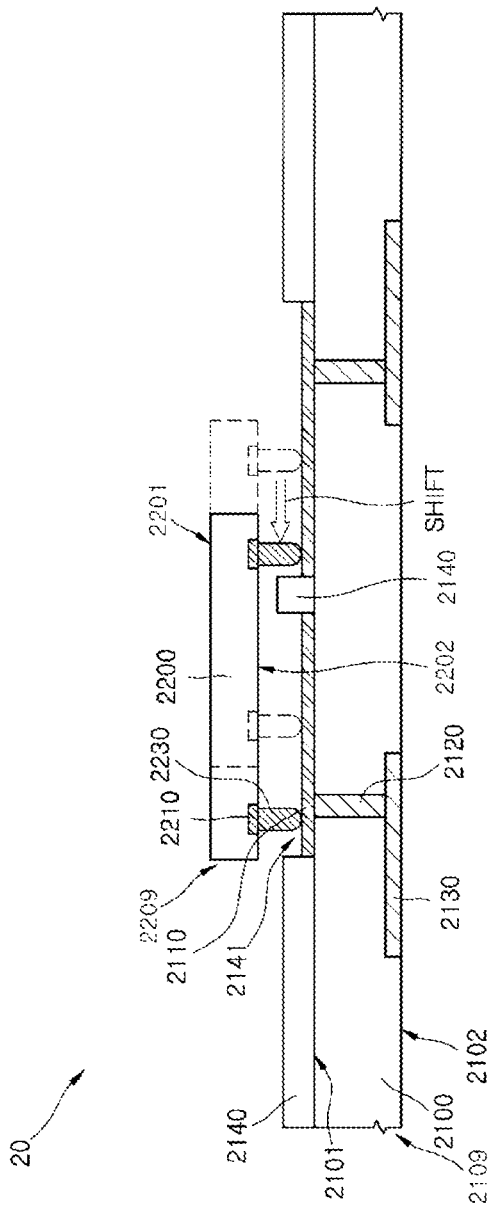
Figure 13:
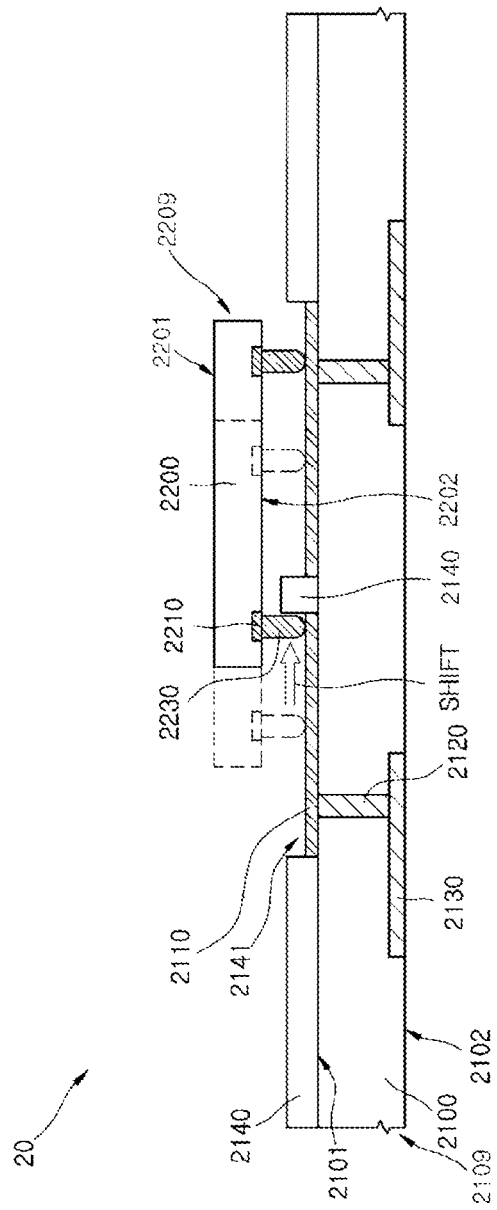

FIG. 11 shows a semiconductor package 20 according to an embodiment, and FIGS. 12 and 13 show a situation where the second substrate 2209 has shifted with respect to the first substrate 2109.

Referring to FIG. 11, the semiconductor package 20 may include a first substrate 2109 and a second substrate 2209 disposed over the first substrate 2109. The interconnect structure electrically and signally connecting the first substrate 2109 and the second substrate 2209 may be provided to include a conductive contact rail 2110 and a conductive projections 2230. The conductive contact rail 2110 and the conductive projections 2230 may include certain portions that are movable without losing electrical connections thereof. The tip end portion of the conductive projection 2230 may have a pointed shape and may be placed in contact with the surface of the conductive contact rail 2110.

As the tip end portion of the conductive projection 2230 is not fixed to the surface of the conductive contact rail 2110, it may slide along the surface of the conductive contact rail 2110 without losing an electrical connection to the conductive contact rail 2110. Even if a relative position of the second substrate 2209 with respect to the first substrate 2109 changes, the tip end portion of each conductive projection 2230 may remain placed in contact with the conductive contact rail 2110 while moving on the conductive contact rail 2110. Accordingly, the first substrate 2109 may remain electrically connected to the second substrate 2209. In spite of the relative displacement of the second substrate 2209 associated with the warpage of either or both of the first substrate 2109 and the second substrate 2209, the tip end portion of the conductive projection 2230 may slide along the surface of the conductive contact rail 2110 to remain placed in contact with the surface of the conductive contact rail 2210, and thus maintain an electrical connection therebetween.

The first substrate 2109 may be a package substrate on which semiconductor chips are mounted. The package substrate may be a printed circuit board, an embedded substrate, or a flexible printed circuit board. The package substrate may be a substrate having a flexibility that allows the package substrate to be warped or bent.

The first substrate 2109 may include a substrate body 2100 that is formed of a flexible material (e.g., a polymer material) such as polyimide, and may include the conductive contact rail 2110 for the electrical connection to the third surface 2101 of the substrate body 2100 facing the first surface 2202 of the second substrate 2209. The second substrate 2209 may include the semiconductor chip body 2200 having a second surface 2202 facing away from the first surface 2201. The conductive contact rail 2110 may be formed of a layer of a conductive material such as copper (Cu) or a metal layer. In an embodiment, the semiconductor package 20 may further include another trace patterns. Although not illustrated, the semiconductor package 20 may further include interconnect patterns that are connected to or spaced apart from the conductive contact rail 2110 on the third surface 2101 of the substrate body 2100.

Second connecting portions 2130 may be disposed on the fourth surface 2102 facing away from the third surface 2101 of the first substrate body 2100. In an embodiment, the second connecting portions 2130 may have a pad shape. The second connecting portions 2130 may be provided as an external-connection terminal that connects the semiconductor package 20 to other external members such as a mother board or other electric devices. Although not illustrated, the second connecting portions 2130 may be formed of connection members such as bumps or solder balls.

An internal connection portion 2120 may be formed in the body 2100 of the first substrate 2109 to connect the conductive contact rail 2110 to the second connecting portions 2130. The internal connection portion 2120 may be provided as a via shape formed inside the body 2100 of the first substrate 2109. The body 2100 of the first substrate 2109 may further include inner trace patterns (not shown) constituting internal signal lines to be electrically connected to the via.

The conductive contact rail 2110 may be disposed on the third surface 2101 of the first substrate 2109. The conductive contact rail 2110 may have a linear shape, a long rectangular shape, or a bar shape extending along the body 2100 of the first substrate 2109. A plurality of conductive contact rails 2110 may be disposed side by side to form a column, and, as illustrated in FIG. 11, two conductive contact rails 2110 may be disposed side by side spaced apart from each other to form two columns. Each of the conductive contact rails 2110 may be provided as a conductive pattern including a conductive layer such as copper (Cu). In addition, guide portions 2140 separating the conductive contact rails 2110 from each other may be disposed on the third surface 2101 of the first substrate 2109. The guide portions 2140 may be formed of a dielectric material or an insulation material. Each of the guide portion 2140 may include a polymer layer such as polyimide (PI) or an insulation layer including silicon oxide (SiO2), silicon nitride (Si3N4), and silicon oxynitride (SiON). The guide portions 2140 may provide trenches 2141 exposing at least a portion of the conductive contact rail 2110. The guide portions 2140 may be thicker than the conductive contact rail 2110. As illustrated in FIG. 12 or FIG. 13, the guide portions 2140 may prevent the conductive projections 2230 from coming out of the conductive contact rail 2110 when the conductive projections 2230 slide along the conductive contact rail 2110. As the guide portions 2140 provides a mechanism that prevent the conductive projections 2230 from coming out of the conductive contact rail 2110, the limit up to which the second substrate 2209 may move may be determined depending on the length of the conductive contact rail 2110.

The semiconductor package 20 may include the first substrate 2109 and the second substrate 2209 mounted on the first substrate 2109. The second substrate 2209 may be a semiconductor chip. Alternatively, the second substrate 2209 may be another package including a semiconductor chip therein. The conductive projections 2230, which protrudes from the first surface 2202 of the semiconductor chip body 2200 toward the second substrate 2209. The conductive projections 2230 may be fixed to the contact connecting portions 2210 provided on the first surface 2202 of the semiconductor chip body 2200. The contact connecting portions 2210 may have a chip pad shape electrically connected to integrated circuits in the semiconductor chip body 2200.

The conductive projections 2230, which protrudes from the contact connecting portions 2210, may be placed in the center portion of the semiconductor chip body 2200 in a case where the contact connecting portions 2210 are provided in a center pad type. If the contact connecting portions 2210 are disposed at both side edges to form two columns, the conductive projections 2230 may be separated into both side edges of the semiconductor chip body 2200. Each conductive contact rail 2110 may be allocated to one of the conductive projections 2230. Therefore, if the conductive projections 2230 are arranged in two columns, a plurality of conductive contact rails 2110 also may be arranged in two columns. The conductive projections 2230 may be a conductive pillar, extended metal bump, stud, or pin.

Figure 14:
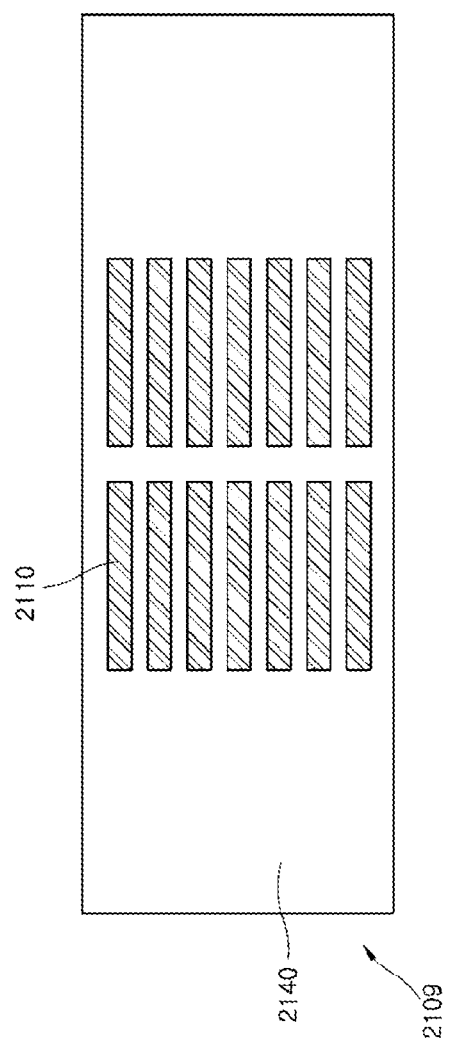
FIG. 14 is a plan view illustrating conductive contact rails employed in the semiconductor package of FIG. 11.

FIG. 14 shows a plan view of the conductive contact rail 2110 of FIG. 11.

Referring to FIG. 14 together with FIG. 11, the conductive contact rails 2110 may be disposed on the first substrate 2109 such that each of the conductive contact rails 2110 extends side by side along a certain direction. The conductive contact rails 2110 may be spaced apart from each other to form two columns. The conductive contact rails 2110 may have the shape extending in the same direction as one another.

Figure 15:
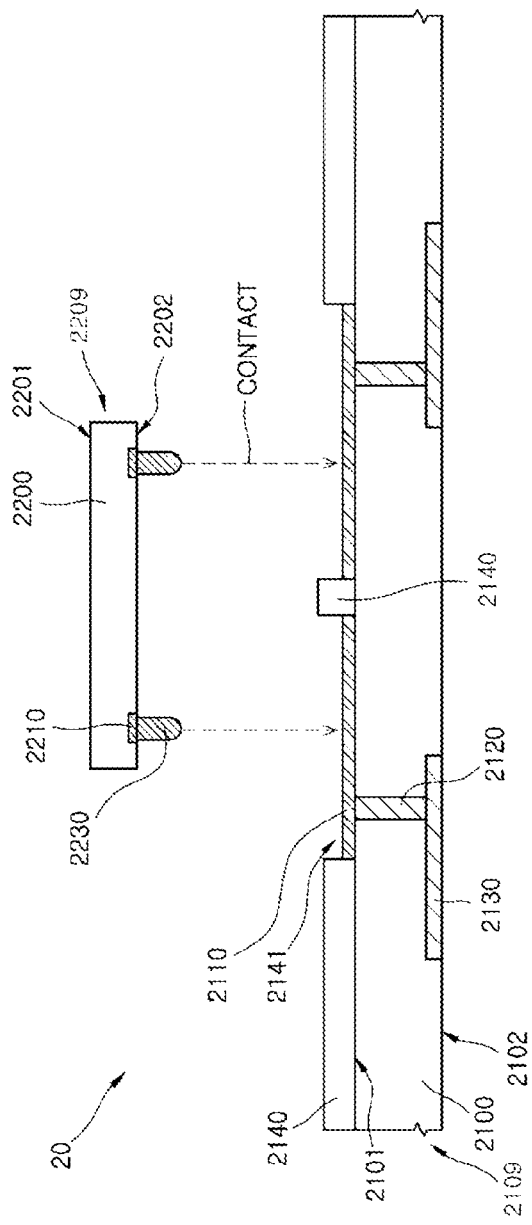
FIG. 15 is a cross-sectional view illustrating a contact between the conductive contact rails and conductive projections employed in the semiconductor package of FIG. 11.

FIG. 15 shows the contact between the conductive contact rails 2110 and the conductive projections 2230 of FIG. 11.

Referring to FIG. 15 together with FIG. 14, the second substrate 2209 may be placed on the first substrate 2109 so that the end portion of each conductive projection 2230 is brought into contact with the surface of the conductive contact rail 2110. Guide portions 2140 may separate each of the conductive contact rails 2110 so that the surface portion of the conductive contact rail 2110 is exposed. The guide portions 2140 may be formed as a dielectric layer pattern providing the guide trenches 2141, which expose the surface of each conductive contact rail 2110 as an opening. Conductive layer patterns forming each conductive contact rails 2110 may be disposed on the bottom portion of the guide trenches 2141. The guide trenches 2140 may be thicker than the conductive layer patterns. As a result, the guide trenches 2141 may have a concave groove shape formed on the surfaces of the conductive contact rails 2110.

The guide portions 2141 may have the height higher than the surface height of the conductive contact rails 2110. The guide portions 2140 may prevent the end portions of the conductive projections 2230, which move along the guide trenches 2141, from coming out of the guide trenches 2141.

FIGS. 16 to 19 show the conductive projections 2230.

Figure 16:
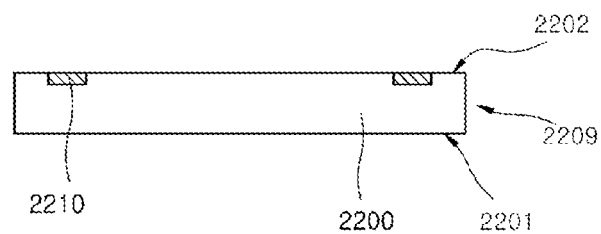
FIGS. 16 to 19 are cross-sectional views and plan views illustrating the conductive projections of FIG. 11.
Figure 17:
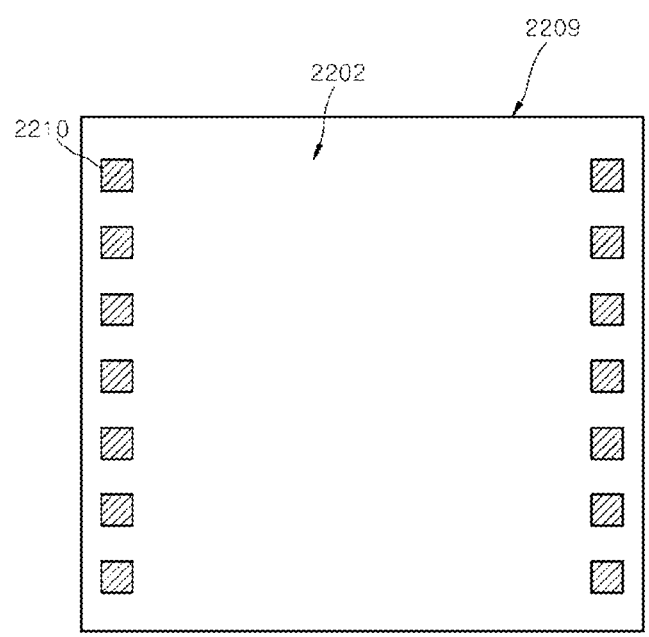

Referring to FIGS. 16 and 17 together with FIG. 11, the contact connecting portions 2210 may be provided on the first surface 2202 of the semiconductor chip body 2200 of the second substrate 2209 in an edge pad shape. The contact connecting portions 2210 may have a shape that both side edges of the semiconductor chip body 2200 form two columns.

Figure 18:
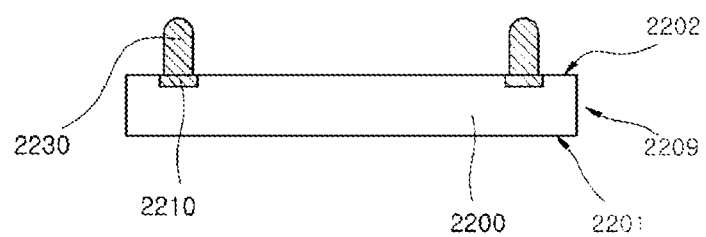
Figure 19:
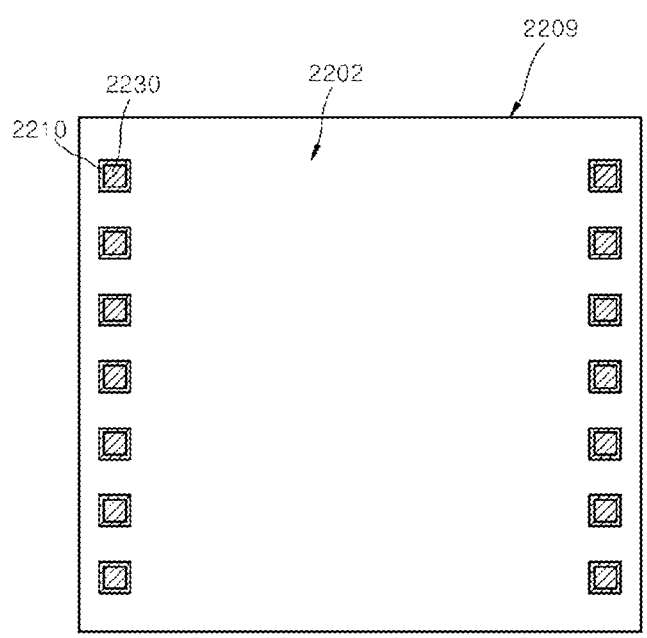

Referring to FIGS. 18 and 19, the conductive projections 2230 may formed on the contact connecting portions 2210 such that conductive projections 2230 protrude from the contact connecting portions 2210. The conductive projections 2230 may be a member extending from the contact connecting portions 2210. The conductive projections 2230 may have a shape of a conductive pillar longer than the contact connecting portions 2210. The conductive projections 2230 may be a metal bump, stud, or pin.

Figure 20:
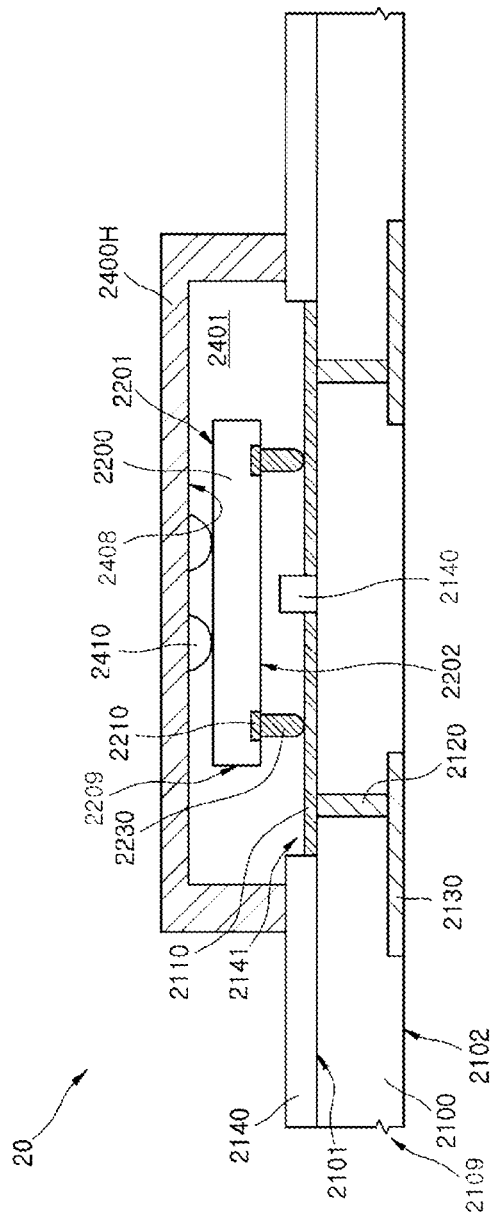
FIG. 20 is a cross-sectional view illustrating a semiconductor package according to an embodiment.

FIG. 20 shows the protection cap portion 2400H protecting the second substrate 2209 of FIG. 11.

Referring to FIG. 20 together with FIG. 11, the semiconductor package 20 may further include a protection cap portion 2400H on the first substrate 2109 to provide an inner space 2401 where the second substrate 2209 is to be disposed. The end portions of the protection cap portion 2400H may be fixed to the first substrate 2109 and the protection cap portion 2400H may provide the inner space 2401, and the protection cap portion 2400H may be provided in a shape that allows the second substrate 2209 to move in the inner space 2401. The protection cap portion 2400H may be formed of a dielectric material or an insulation material. In some embodiments, the protection cap portion 2400H may be formed of a metallic material.

The protection cap portion 2400H, which support the second substrate 2209, may apply force so that the pointed end portion of the each conductive projection 2230 can remain placed in contact with the surface of the conductive contact rail 2110. In addition, one or more pressing projections 2410 protruding from the surface may be provided at the upper inner surface 2409 of the protection cap portion 2400H. The pressing projections 2410, which are formed of a flexible material, may provide the force so that the second substrate 2209 is pushed toward the first substrate 2109. As a result, when the second substrate 2209 is inserted into the inner space 2401 provided by the protection cap portion 2400H, the second substrate 2209 may remain placed on the first substrate 2109 without losing an electrical connection therebetween. As shown in FIGS. 12 and 13, even if the second substrate 2209 moves along the surface of the first substrate 2109, the force pressing the second substrate 2209 may be continuously applied, the conductive projections 2230 may remain placed in contact with the conductive contact rail 2110 while sliding along the surface of the conductive contact rail 2110.

Figure 21:
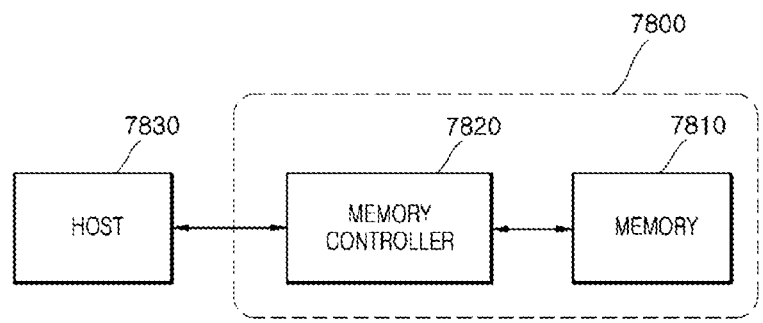
FIG. 21 is a block diagram illustrating an electronic system employing a memory card including a package in accordance with an embodiment.

FIG. 21 is a block diagram illustrating an electronic system including a memory card 7800 with at least one semiconductor device according to an embodiment. The memory card 1800 includes a memory 7810 (e.g., a nonvolatile memory device) and a memory controller 7820. The memory card 1800 may store data or read stored data. The memory 7810 and/or the memory controller 7820 may include one or more semiconductor chips disposed in an embedded package according to an embodiment.

The memory 7810 may include a memory device to which the technology of the embodiments of the present invention is applied. The memory controller 7820 may control read and write operations of the memory 7810 in response to read and write requests from a host 7830.

Figure 22:
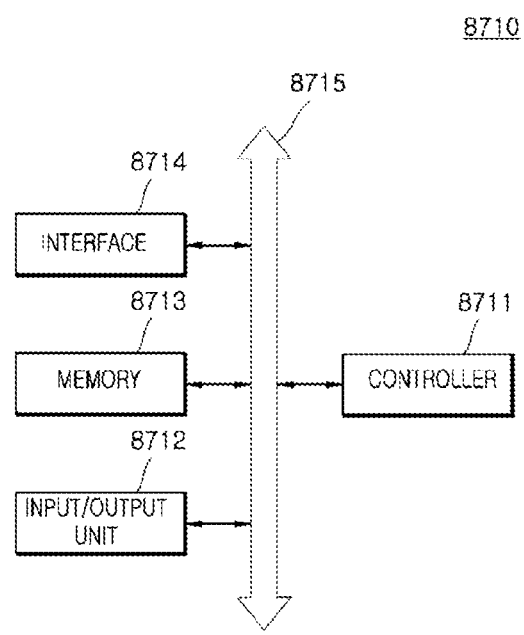
FIG. 22 is a block diagram illustrating an electronic system including a package in accordance with an embodiment.

FIG. 22 is a block diagram illustrating an electronic system 8710 including at least one device according to an embodiment. The electronic system 8710 may include a controller 8711, an input/output unit 8712, and a memory 8713 coupled to one another through a bus 8715, which provides a signal path.

In an embodiment, the controller 8711 may include one or more of microprocessor, digital signal processor, and microcontroller. Not only the memory 8713 but also the controller 8711 may include one or more of the semiconductor packages according to embodiments of the present disclosure. The input/output device 8712 may include at least one selected between a keypad, a keyboard, a display device, and a touchscreen. The memory 8713 is a device for storing data. The memory 8713 may store data and/or commands to be executed by the controller 8711.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 that transmits and receives data to and from a communication network. The interface 8714 may be a wired or wireless type. For example, the interface 8714 may include an antenna, a wired, or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 is an equipment capable of performing wireless communication, the electronic system 8710 may be used in a communication system such as of code division multiple access (CDMA), global system for mobile communications (GSM), north American digital cellular (NADC), enhanced-time division multiple access (E-TDMA), wideband code division multiple access (WCDAM), CDMA2000, long term evolution (LTE), and wireless broadband Internet (Wibro).

Embodiments of the present disclosure have been disclosed above for illustrative purposes. Those skilled in the art will appreciate that various modifications, additions and substitutions are possible, without departing from the scope and spirit of the present disclosure as disclosed in the accompanying claims.

What is claimed is:

1. A semiconductor package comprising:
   a first substrate including a plurality of first connecting portions disposed on the first substrate;
   a second substrate comprising a semiconductor chip body including a plurality of conductive contact rails disposed thereon, wherein the second substrate is placed over the first substrate to be adjacent to the plurality of first connecting portions; and
   a plurality of conductive cantilevers, one end portion of each conductive cantilever being electrically coupled to the respective first connecting portion, wherein the other end portion of each conductive cantilever remains placed in an electrical contact with a surface of the conductive contact rail while sliding along the surface of the conductive contact rail.

2. The semiconductor package of claim 1, wherein the semiconductor chip body has
   a first surface facing the first substrate and a second surface facing away from the first substrate;
   a dielectric layer portion covering the second surface of the semiconductor chip body, wherein the conductive contact rails are located on the dielectric layer portion; and
   a contact connecting portion penetrating through the dielectric layer portion so as to connect each of the conductive contact rails to the semiconductor chip body.

3. The semiconductor package of claim 2, further comprising a guide portion disposed on the dielectric layer portion to expose the conductive contact rails, wherein:
the guide portion provides guide trenches exposing the surfaces of the conductive contact rails;
the guide trenches allow the other end portions of the conductive cantilevers to slide along the respective conductive contact rails; and
the guide portion isolates the conductive contact rails from each other.

4. The semiconductor package of claim 3, wherein each of the guide trenches has a line shape extending in one direction along the second surface of the semiconductor chip body, and the plurality of the guide trenches are disposed side by side to be parallel with each other.

5. The semiconductor package of claim 1, wherein each of the conductive cantilevers comprises:
a body disposed over the second substrate and extending along the surface of the second substrate so as to connect the end portion to the other end portion; and
a probe-shaped portion protruding from the body toward the surface of the conductive contact rail at the other end portion and pressing the surface of the conductive contact rail.

6. The semiconductor package of claim 5, wherein the body of the conductive cantilever extends in the direction that the conductive contact rail extends.

7. The semiconductor package of claim 5, further comprising a plurality of conductive pillars having both ends, wherein:
an end portion of the conductive pillar is connected to the one end portion of the conductive cantilever to fix the conductive cantilever; and
the other end portion of the conductive pillar is fixed to the first connecting portion and electrically connects the conductive cantilever to the first connecting portion.

8. The semiconductor package of claim 7, wherein the conductive pillar has a clip shape fixing the conductive cantilever to the first substrate and allowing the second substrate to be inserted into the space between the conductive cantilever and the first substrate.

9. The semiconductor package of claim 5, further comprising a protection lid portion configured to support the conductive cantilever, wherein the conductive cantilever is fixed to a surface of the protection lid portion.

10. The semiconductor package of claim 9, further comprising a protection cap portion fixed to the first substrate, wherein the protection lid portion extends to provide an inner space, and the second substrate is disposed in the inner space.

11. The semiconductor package of claim 1, wherein the first substrate further comprises:
second connecting portions located on a fourth surface facing away from a third surface that the first connecting portions are disposed thereon; and
internal connection portions penetrating through a body of the first substrate and connecting the first connecting portions to the respective second connecting portions.

12. The semiconductor package of claim 1, wherein the first substrate comprises a package substrate that the semiconductor chip body is mounted thereon.

* * * * *